US008765222B2

(12) United States Patent
Ooshika et al.

(10) Patent No.: US 8,765,222 B2
(45) Date of Patent: Jul. 1, 2014

(54) METHOD OF MANUFACTURING A P-ALGAN LAYER

(75) Inventors: Yoshikazu Ooshika, Tokyo (JP); Tetsuya Matsuura, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 21 days.

(21) Appl. No.: 13/512,747

(22) PCT Filed: Dec. 10, 2010

(86) PCT No.: PCT/JP2010/072728
§ 371 (c)(1),
(2), (4) Date: Jun. 8, 2012

(87) PCT Pub. No.: WO2011/071191
PCT Pub. Date: Jun. 16, 2011

(65) Prior Publication Data
US 2012/0248387 A1    Oct. 4, 2012

(30) Foreign Application Priority Data

Dec. 10, 2009  (JP) .................................. 2009-280963
Dec. 9, 2010   (JP) .................................. 2010-275128

(51) Int. Cl.
*C23C 16/34*    (2006.01)

(52) U.S. Cl.
USPC ........... 427/255.32; 427/255.34; 427/255.394

(58) Field of Classification Search
USPC ............ 427/255.23, 255.34, 255.394, 255.32
See application file for complete search history.

(56) References Cited

U.S. PATENT DOCUMENTS

| | | | |
|---|---|---|---|
| 6,627,552 B1 * | 9/2003 | Nishio et al. | 438/694 |
| 2002/0171091 A1 * | 11/2002 | Goetz et al. | 257/103 |
| 2003/0080343 A1 * | 5/2003 | Tominaga | 257/89 |
| 2003/0209704 A1 * | 11/2003 | Yamada | 257/14 |
| 2006/0183260 A1 * | 8/2006 | Kamei et al. | 438/45 |

(Continued)

FOREIGN PATENT DOCUMENTS

| | | |
|---|---|---|
| JP | A-2006-5331 | 1/2006 |
| JP | A-2007-42886 | 2/2007 |

(Continued)

OTHER PUBLICATIONS

Kozodoy, Peter, et al., "Enhanced Mg doping efficiency in Al0.2Ga0.8N/GaN superlattices." Applied Physics Letters, vol. 74, No. 24, Jun. 14, 1999, pp. 3681-3683.*

(Continued)

*Primary Examiner* — Bret Chen
(74) *Attorney, Agent, or Firm* — Oliff PLC

(57) ABSTRACT

The method according to the present invention includes a first step of supplying the Group V source gas at a flow rate $B_1$ ($0<B_1$) and supplying the gas containing magnesium at a flow rate $C_1$ ($0<C_1$) while supplying the Group III source gas at a flow rate $A_1$ ($0 \le A_1$); and a second step of supplying a Group V source gas at a flow rate $B_2$ ($0<B_2$) and supplying a gas containing magnesium at a flow rate $C_2$ ($0<C_2$) while supplying a Group III source gas at a flow rate $A_2$ ($0<A_2$). The first step and the second step are repeated a plurality of times to form a p-$Al_xGa_{1-x}N$ ($0 \le x<1$) layer, and the flow rate $A_1$ is a flow rate which allows no p-$Al_xGa_{1-x}N$ layer to grow and satisfies $A_1 \le 0.5\, A_2$.

10 Claims, 9 Drawing Sheets

(56) References Cited

U.S. PATENT DOCUMENTS

| | | | |
|---|---|---|---|
| 2007/0096077 A1* | 5/2007 | Sanga et al. | 257/13 |
| 2007/0164306 A1 | 7/2007 | Nakahata et al. | |
| 2008/0014671 A1 | 1/2008 | Yamamoto et al. | |
| 2008/0247433 A1* | 10/2008 | Tsuchiya et al. | 372/45.011 |
| 2008/0273566 A1* | 11/2008 | Nishinaka et al. | 372/45.012 |
| 2010/0220761 A1* | 9/2010 | Enya et al. | 372/45.01 |

FOREIGN PATENT DOCUMENTS

| | | |
|---|---|---|
| JP | A-2008-21717 | 1/2008 |
| JP | A-2008-78186 | 4/2008 |
| JP | 2008-251643 | * 10/2008 |

OTHER PUBLICATIONS

Nakamura, Shuji, et al., InGaN/GaN/AlGaN-based laser diodes with modulation-doped strained-layer superlattices grown on an epitaxially laterally overgrown GaN substrate. Appl. Phys. Lett. 72 (2), Jan. 12, 1998, pp. 211-213.*

Khan, M.A., et al., "Photoliuminescence characteristics of AlGaN—GaN—AlGaN quantum wells". Appl. Phys. Lett. 56 (13), Mar. 26, 1990, pp. 1257-1259.*

International Search Report issued in International Patent Application No. PCT/JP2010/072728 dated Mar. 1, 2011.

Office Action issued in Japanese Patent Appiication No. 2010-275128 dated \ Feb. 22, 2011 (with translation).

* cited by examiner (a)

(b)

(a)

Plane a [11-20]

(b)

Plane a [11-20]

METHOD OF MANUFACTURING A P-ALGAN LAYER

TECHNICAL FIELD

The present invention relates to a p-AlGaN layer, and in particular to a magnesium-doped p-AlGaN layer having constant aluminum composition ratio. The present invention also relates to a method of manufacturing the same, and a Group III nitride semiconductor light emitting device using the same.

RELATED ART

In recent years, ultraviolet LEDs using Group III nitride semiconductor devices are actively researched and developed since they are expected to be used for back lights of liquid crystal displays, excitation light sources of white LEDs for lighting and sterilization, and medical uses, etc.

In general, the conductivity type of semiconductors is determined depending on the kind of impurities added. By way of example, when an AlGaN material is made to have p-type conductivity, magnesium is typically used as an impurity. On this occasion, the magnesium added serves as acceptors, and holes in this AlGaN material serve as carriers.

However, when a semiconductor layer is thus formed by MOCVD (metal organic chemical vapor deposition) using magnesium as an impurity, a phenomenon called "doping delay" in which impurities are not sufficiently introduced into the semiconductor layer in growth would occur.

One of the reasons for this is that magnesium to be supplied to the semiconductor layer would adhere to inner walls and the like of a growth system and pipes in an initial stage of the growth of the semiconductor layer and it would not be supplied sufficiently to the semiconductor layer accordingly.

On the other hand, Patent Document 1 discloses a technique of preventing doping delay by supplying a magnesium-containing gas into a growth system prior to the formation of the semiconductor layer so that the amount of the above-described adherence is saturated.

Beside such doping delay in an initial growth stage of a semiconductor layer, doping delay is also known to occur after the initial growth stage. One of the reasons is for example as follows. For example, hydrogen atoms generated when a gas supplied into the semiconductor layer in growth is partially introduced into crystals are bound to nitrogen atoms in the crystals by hydrogen-bonding to release electrons. Meanwhile, holes are released from magnesium atoms which are p-type impurities disposed at lattice arrangements where gallium atoms should originally be disposed. The released electrons and the released holes are combined to electrically compensate one another, which consequently prevents magnesium added for achieving p-type conductivity from serving as acceptors. This leads to decline in the carrier concentration in the semiconductor layer.

Further, shorter wavelength ultraviolet LEDs increase demand for $Al_xGa_{1-x}N$ materials having a high aluminum composition ratio and a wide band gap for use in an active layer. A high aluminum composition ratio x increases ionization energy of magnesium itself; therefore, it has been difficult to achieve high carrier concentration.

Such decline in the carrier concentration increases resistance, and this causes heat generation or the like, which makes it impossible to obtain sufficient light output.

PRIOR ART DOCUMENT

Patent Document

[Patent Document 1] JP2007-42886 A

DISCLOSURE OF THE INVENTION

Problems to be Solved by the Invention

An object of the invention is to solve the above problems and to provide a p-AlGaN layer achieving improved carrier concentration and light output, a method of manufacturing the same, and a Group III nitride semiconductor light emitting device using the same.

Means for Solving the Problem

In order to achieve the above object, the present invention primarily includes the following components.

(1) A method of manufacturing a p-AlGaN layer, the p-AlGaN layer being one p-$Al_xGa_{1-x}N$ layer ($0 \leq x < 1$) doped with magnesium, which is formed by MOCVD, comprising the steps of: a first step of supplying a Group V source gas at a Group V source gas flow rate $B_1$ ($0 < B_1$) and supplying a gas containing magnesium at a Mg-containing gas flow rate $C_1$ ($0 < C_1$) while supplying a Group III source gas at a Group III source gas flow rate $A_1$ ($0 \leq A_1$); and a second step of supplying a Group V source gas at a Group V source gas flow rate $B_2$ ($0 < B_2$) and supplying a gas containing magnesium at a Mg-containing gas flow rate $C_2$ ($0 < C_2$) while supplying a Group III source gas at a Group III source gas flow rate $A_2$ ($0 < A_2$), wherein the first step and the second step are repeated a plurality of times to form the p-$Al_xGa_{1-x}N$ layer, and the Group III source gas flow rate $A_1$ is a flow rate which allows no p-$Al_xGa_{1-x}N$ layer to grow and satisfies $A_1 \leq 0.5 A_2$.

(2) A method of manufacturing a p-AlGaN layer, the p-AlGaN layer being one p-$Al_xGa_{1-x}N$ layer ($0 \leq x < 1$) doped with magnesium, which is formed by MOCVD, comprising the steps of: a first step of supplying a Group V source gas at a Group V source gas flow rate $B_1$ ($0 < B_1$) and supplying a gas containing magnesium at a Mg-containing gas flow rate $C_1$ ($0 < C_1$) while supplying a Group III source gas at a Group III source gas flow rate $A_3$ ($0 < A_3$); and a second step of supplying a Group V source gas at a Group V source gas flow rate $B_2$ ($0 < B_2$) and supplying a gas containing magnesium at a Mg-containing gas flow rate $C_2$ ($0 < C_2$) while supplying a Group III source gas at a Group III source gas flow rate $A_2$ ($0 < A_2$), wherein the first step and the second step are performed to form the p-$Al_xGa_{1-x}N$ layer, and the Group III source gas flow rate $A_3$ is a flow rate which allows only initial growth nuclei of the p-$Al_xGa_{1-x}N$ layer to grow and satisfies $A_3 \leq 0.5 A_2$.

(3) A method of manufacturing a p-AlGaN layer, the p-AlGaN layer being one p-$Al_xGa_{1-x}N$ layer ($0 \leq x1$) doped with magnesium, which is formed by MOCVD, comprising the steps of: a first step of supplying a Group V source gas at a Group V source gas flow rate $B_1$ ($0 < B_1$) and supplying a gas containing magnesium at a Mg-containing gas flow rate $C_1$ ($0 < C_1$) while supplying a Group III source gas at a Group III source gas flow rate $A_3$ ($0 < A_3$); and a second step of supplying a Group V source gas at a Group V source gas flow rate $B_2$ ($0 < B_2$) and supplying a gas containing magnesium at a Mg-containing gas flow rate $C_2$ ($0 < C_2$) while supplying a Group III source gas at a Group III source gas flow rate $A_2$ ($0 < A_2$), wherein the first step and the second step are repeated a plurality of times to form the p-$Al_xGa_{1-x}N$ layer, and the Group III source gas flow rate $A_3$ is a flow rate which allows only initial growth nuclei of the p-$Al_xGa_{1-x}N$ layer to grow and satisfies $A_3 \leq 0.5A_2$.

(4) The method of manufacturing a p-AlGaN layer according to any one of (1) to (3) above, wherein the Group V source gas flow rate $B_1$ in the first step is equal to the Group V source gas flow rate $B_2$ in the second step, and/or the Mg-containing gas flow rate $C_1$ in the first step is equal to the Mg-containing gas flow rate $C_2$ in the second step.

(5) The method of manufacturing a p-AlGaN layer according to any one of (1) to (4) above, wherein when a relationship between a Group III source gas flow rate and a crystal growth rate is evaluated from the crystal growth rate in the second step, the Group III source gas flow rate in the first step is a flow rate such that a growth rate of the p-$Al_xGa_{1-x}N$ layer corresponding to the flow rate is 0.03 nm/s or less.

(6) The method of manufacturing a p-AlGaN layer according to any one of (1) to (5) above, wherein the aluminum composition ratio x of the p-$Al_xGa_{1-x}N$ layer is in the range of 0 to 0.8.

(7) A Group III nitride semiconductor light emitting device comprising a p-$Al_xGa_{1-x}N$ layer manufactured by the method of manufacturing a p-AlGaN layer according to any one of (1) to (6) above.

(8) A p-AlGaN layer doped with magnesium, which has an aluminum composition ratio x of 0.2 or more and less than 0.3 and a carrier concentration of $5 \times 10^{17}/cm^3$ or more.

(9) A p-AlGaN layer doped with magnesium, which has an aluminum composition ratio x of 0.3 or more and less than 0.4 and a carrier concentration of $3.5 \times 10^{17}/cm^3$ or more.

(10) A p-AlGaN layer doped with magnesium, which has an aluminum composition ratio x of 0.4 or more and less than 0.5 and a carrier concentration of $2.5 \times 10^{17}/cm^3$ or more.

(11) A Group III nitride semiconductor light emitting device comprising the p-$Al_xGa_{1-x}N$ layer according to any one of (8) to (10) above.

Effect of the Invention

The present invention can provide a p-AlGaN layer having a carrier concentration and a light output which are improved by forming one p-AlGaN layer doped with magnesium using MOCVD under conditions where a Group III source gas is supplied in a first step at a flow rate of 0 or at a flow rate equal to or less than a flow rate of a Group III source gas supplied in a second step. The present invention can also provide a method of manufacturing the same and a Group III nitride semiconductor light emitting device.

Further, the present invention can provide a p-AlGaN layer achieving a carrier concentration and a light output which are improved by repeating the first step and the second step a plurality of times, a method of manufacturing the same, and a Group III nitride semiconductor light emitting device.

BEST MODE FOR CARRYING OUT THE INVENTION

Figure 1:
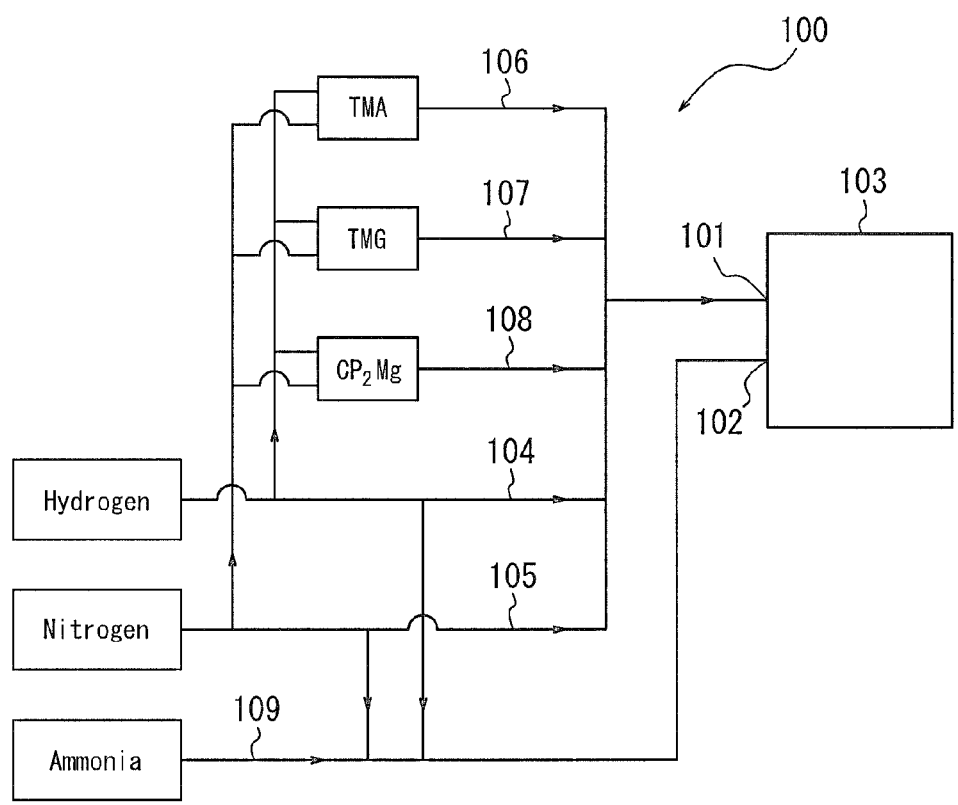
FIG. 1 is a schematic view illustrating an example of an MOCVD system for manufacturing a p-AlGaN layer in accordance with the present invention.

Next, embodiments of a method of manufacturing a p-AlGaN layer in accordance with the present invention will be described with reference to the drawings. FIG. 1 is a schematic cross-sectional view illustrating an example of an MOCVD system for manufacturing a p-AlGaN layer in accordance with the present invention. This MOCVD system 100 includes a reaction furnace 103 having a first gas supply port 101 and a second gas supply port 102. The first gas supply port 101 supplies a carrier gas such as hydrogen gas 104 and/or nitrogen gas 105, a Group III source gas such as TMA (trimethylaluminium) 106 and TMG (trimethylgallium) 107, a magnesium-containing gas 108 as an impurity source gas, and/or the like to the reaction furnace 103. Meanwhile, the second gas supply port 102 supplies a carrier gas such as hydrogen gas 104 and/or nitrogen gas 105, and a Group V source gas 109 such as ammonia to the reaction furnace 103.

With respect to a method of manufacturing a p-AlGaN layer in accordance with the present invention, magnesium-doped p-$Al_xGa_{1-x}N$ ($0 \leq x < 1$) having constant aluminum composition ratio x is formed using such an MOCVD system 100 described above by a first step of supplying a Group V source gas at a Group V source gas flow rate $B_1$ ($0 < B_1$) and supplying a gas containing magnesium at a Mg-containing gas flow rate $C_1$ ($0 < C_1$) while supplying a Group III source gas at a Group III source gas flow rate $A_1$ ($0 \leq A_1$); and a second step of supplying a Group V source gas at a Group V source gas flow rate $B_2$ ($0 < B_2$) and supplying a gas containing magnesium at a Mg-containing gas flow rate $C_2$ ($0 < C_2$) while supplying a Group III source gas at a Group III source gas flow rate $A_2$ ($0 < A_2$). The first step and the second step are repeated a plurality of times to form the p-$Al_xGa_{1-x}N$ layer, and the Group III source gas flow rate $A_1$ is a flow rate which allows no p-$Al_xGa_{1-x}N$ layer to grow and satisfies $A_1 \leq 0.5A_2$. Thus, the carrier concentration and light output of the p-AlGaN layer can be improved.

Here, cases where "the Group III source gas flow rate $A_1$ is a flow rate which allows no p-AlGaN layer to grow" mean cases where "the thickness of p-AlGaN is not enough to form a substantial layer" to include such cases where no p-AlGaN is grown, or where an initial crystal nucleus of p-AlGaN (for example, an island-like crystal) is grown but the thickness is not enough to form a substantial layer. Specifically, the case include a case where $A_1$ is a flow rate which allows no p-AlGaN to grow (at least the cases where $A_1=0$ apply to these)

and cases where $A_1$ is a flow rate which allows only initial growth nuclei of p-AlGaN to grow (at least the cases where $A_1>0$ apply to these). Such a Group III source gas flow rate $A_1$ satisfies at least the relation $0 \leq A_1 \leq 0.5A_2$. Further, the first step serves to maintain the state where no layer is grown for an intended period. On this occasion, the Group V source gas flow rate $B_1$ and the Mg-containing gas flow rate $C_1$ are preferably equal to or more than a flow rate which allows a layer to grow as long as the Group III source gas is supplied. In other words, $B_1 \geq B_2$ and $C_1 \geq C_2$ are preferably satisfied. This is to prevent nitrogen leakage and supply enough Mg into the system while the layer growth is interrupted.

Further, when two kinds of gases, TMA (trimethylaluminium) and TMG (trimethylgallium) for example, are supplied as Group III source gases, the Group III source gas flow rate $A_1$ represents the total flow rate of these gases.

Note that "the aluminum composition ratio is constant" means that the aluminum composition ratio x of the layer which is grown in each of the second steps does not change irrespective of the repeat count of the first step and the second step. Specifically, this means that the gas flow rate $A_1$ in each repetition is an equal flow rate. However, in measuring the aluminum quantity by SIMS, in terms of the analysis principle, the aluminum composition ratio varies in the depth direction. Further, the aluminum composition ratio may be fluctuated in the layer or aluminum may be distributed in the plane, due to the system in epitaxial growth. Such phenomena can be accepted because they are caused also in conventional methods. Note that the aluminum composition in the present invention is a value measured at the substrate center.

Figure 3:
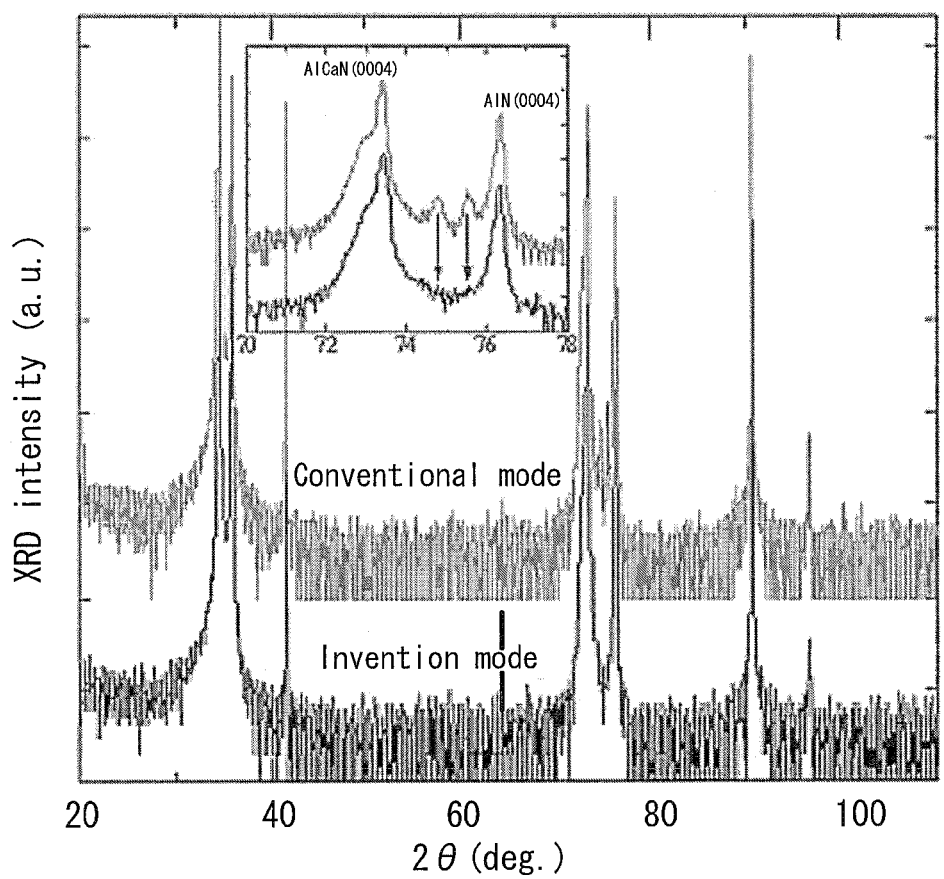
FIG. 3 shows XRD diffraction patterns of p-$Al_{0.23}Ga_{0.77}N$ layers in accordance with a method of the present invention and a conventional method.
Figure 4:
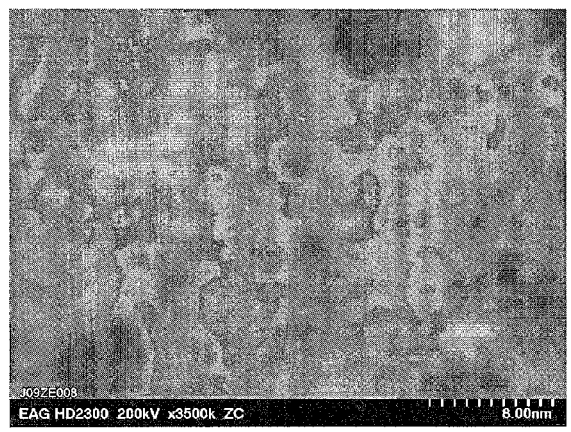
FIGS. 4(a) and 4(b) show TEM images of p-$Al_{0.23}Ga_{0.77}N$ layers in accordance with a method of the present invention and a conventional method, respectively.
Figure 4:
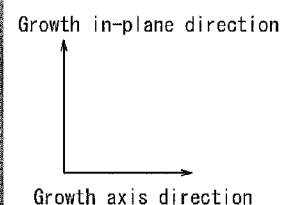
Figure 4:
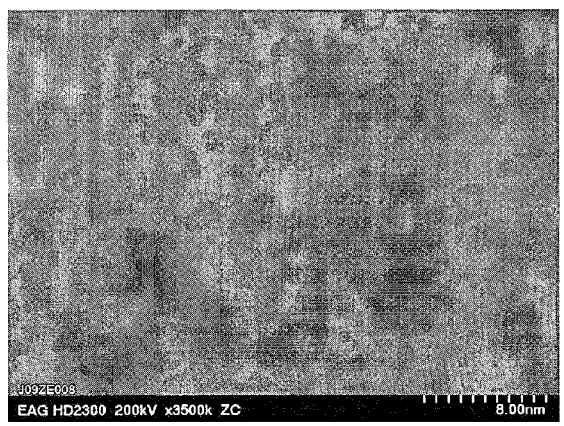
Figure 4:
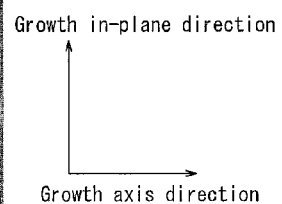
Figure 5:
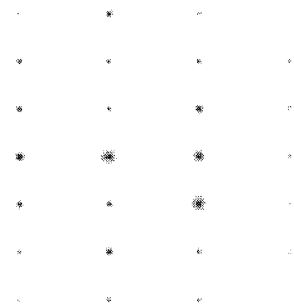
FIGS. 5(a) and 5(b) show differential interference contrast micrographs of the outermost surfaces of p-$Al_{0.23}Ga_{0.77}N$ layers in accordance with a method of the present invention and a conventional method, respectively.
Figure 5:
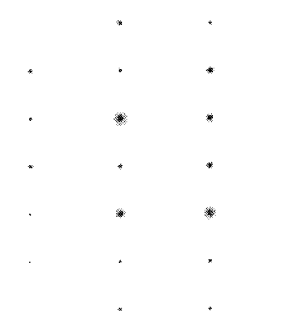

FIG. 3 is an x-ray diffraction (XRD) image of a p-$Al_{0.23}Ga_{0.77}N$ layer (supply of the Group III source gas is modulated: mode of the present invention) manufactured by a method in accordance with the present invention and a p-$Al_{0.23}Ga_{0.77}N$ layer (Group III source gas without supply modulation: conventional mode) manufactured by a conventional method. Table 1 shows representative values of XRD intensity corresponding to Miller indices [002] and [102] which provide indications of crystal quality. The former represents "tilt" with respect to the growth axis direction of an initial growth nucleus, while the latter represents the degree of "twist" with respect to the growth in-plane direction. FIGS. 4(a) and 4(b) show transmission electron microscope (TEM) images of p-$Al_{0.23}Ga_{0.77}N$ layers in accordance with a method of the present invention and a conventional method, respectively. FIGS. 5(a) and 5(b) show electron diffraction patterns of the outermost surfaces of p-$Al_{0.23}Ga_{0.77}N$ layers in accordance with a method of the present invention and a conventional method, respectively.

TABLE 1

| XRD | [002] | [102] |
|---|---|---|
| Invention mode | 195 | 456 |
| Conventional mode | 234 | 442 |

As shown in FIG. 3 and FIGS. 4(a) and 4(b), a method of the present invention is equivalent to a conventional method in macroscopic XRD spectra, and no periodic perturbation in crystal growth was observed in the microscopic TEM images and the electron diffraction patterns. Thus, only one single crystal layer is found to be grown in either case. Note that while XRD spectra of FIG. 3 have two peaks caused by components of different axes at approximately 75° in the conventional mode, these peaks are lost in the method of the present invention. Further, the representative value corresponding to Miller index [002] shown in Table 1 is reduced. Thus, the present invention is found to contribute to the improvement in crystallinity. Note that Table 1 shows that the component "twist" with respect to the growth in-plane direction of the initial growth nucleus differs little, while the "tilt" with respect to the growth axis direction is reduced. This suggests that the components of different axes are reduced, and the orientation of the initial growth nuclei in the growth direction is improved.

Figure 2:
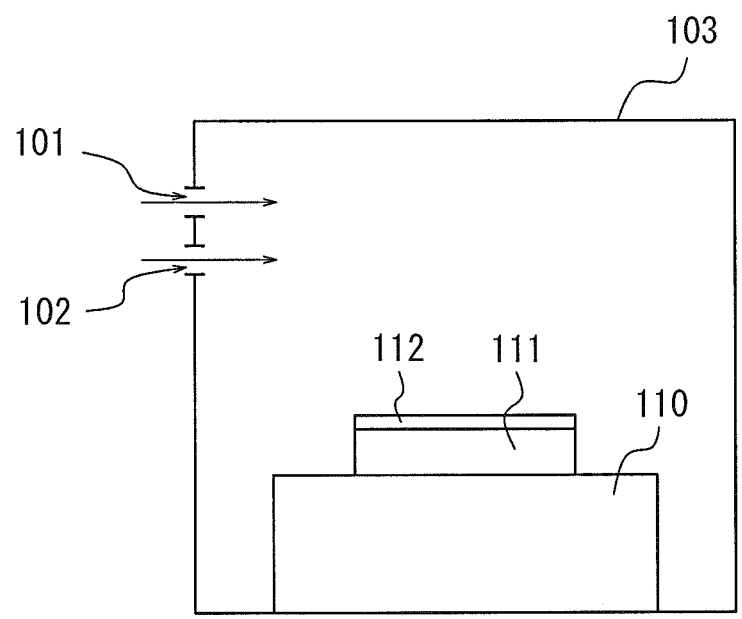
FIG. 2 is a schematic cross-sectional view illustrating an example of a growth furnace in an MOCVD system for manufacturing a p-AlGaN layer in accordance with the present invention.

A method of manufacturing a p-AlGaN layer in accordance with the present invention will be described. First, as shown in FIG. 2, a base substrate 111 is placed on a susceptor 110 in the reaction furnace 103. Examples of the base substrate 111 include a GaN substrate, a sapphire substrate, and an AlN template substrate in which an AlN layer is provided on a sapphire substrate. Alternatively, such a substrate on which a semiconductor layer is stacked may be used.

Next, in a first step, a carrier gas such as hydrogen gas 104 and/or nitrogen gas 105 and a Group V source gas 109 such as ammonia are supplied from the second gas supply port 102 into this reaction furnace 103. Further, a Group III source gas is supplied from the first gas supply port 101 into this reaction furnace 103 at a flow rate which does not result in layer growth or at a flow rate which causes only initial nucleus growth. Along with these source gases, a magnesium-containing gas 108 is supplied. The Group V source gas 109 here is supplied to control decline in partial pressure of nitrogen in the reaction furnace 103 and to protect the outer most surface where crystal growth occurs. Note that $CP_2Mg$ (bis-cyclopentadienyl magnesium) or the like can be used as the magnesium-containing gas 108.

After a predetermined time, in a second step, a Group III source gas is supplied from the first gas supply port 101 at a flow rate which results in layer growth. Along with this source gas, a magnesium-containing gas 108 is supplied. Concurrently, a Group V source gas 109 is supplied from the second gas supply port 102 at a flow rate which results in layer growth. Note that the above "predetermined period of time" for maintaining the first step is preferably about 5 seconds or more and 60 seconds or less. When the predetermined period is too short, the effects of the present invention cannot be obtained sufficiently. Otherwise when the predetermined time is too long, Mg is introduced excessively, which would make Mg cause defects to deteriorate the crystallinity or reduce carrier concentration in subsequent crystal growth.

In a method of manufacturing a p-AlGaN layer in accordance with the present invention, the p-$Al_xGa_{1-x}N$ layer ($0 \leq x < 1$) doped with magnesium is formed using MOCVD by a first step of supplying a Group V source gas at a Group V source gas flow rate $B_1$ ($0<B_1$) and supplying a gas containing magnesium at a Mg-containing gas flow rate $C_1$ ($0<C_1$) while supplying a Group III source gas at a Group III source gas flow rate $A_3$ ($0<A_3$); and a second step of supplying a Group V source gas at a Group V source gas flow rate $B_2$ ($0<B_2$) and supplying a gas containing magnesium at a Mg-containing gas flow rate $C_2$ ($0<C_2$) while supplying a Group III source gas at a Group III source gas flow rate $A_2$ ($0<A_2$). The first step and the second step are performed to form the p-$Al_xGa_{1-x}N$ layer, and the Group III source gas flow rate $A_3$ is a flow rate which allows only initial growth nuclei of the p-$Al_xGa_{1-x}N$ layer to grow and satisfies $A_3 \leq 0.5A_2$. With such a method, surfaces of the reaction furnace 103 and the pipes and the like can be previously coated with adequate magnesium. This makes it possible to suppress reduction in the magnesium concentration of the AlGaN layer in initial growth, namely, doping delay. Here, the flow rate which allows only initial nuclei to grow refers to a flow rate which leads to a state where for example, island-like initial crystal nuclei are formed but the thickness is not enough to form a substantial layer. Such a Group III source gas flow rate $A_3$ satisfies at least the relation $0<A_3\leq 0.5A_2$. Note that in the present invention, the growth of only initial growth nuclei can be confirmed by observing the surface of a substrate of which growth is interrupted after the first step with the use of a metallurgical microscope or a SEM to find island-like initial growth nuclei dispersed on the substrate surface.

Further, when two kinds of gases, TMA (trimethylaluminium) and TMG (trimethylgallium) for example, are supplied as Group III source gases, the Group III source gas flow rate $A_3$ represents the total flow rate of these gases.

The Group V source gas flow rate $B_1$ in the first step is preferably equal to the Group V source gas flow rate $B_2$ in the second step, and/or the Mg-containing gas flow rate $C_1$ in the first step is preferably equal to the Mg-containing gas flow rate $C_2$ in the second step. That is, it is preferable that the flow rate $A_1$ or $A_3$ of the Group III source gas in the first step is different from the flow rate $A_2$ of the Group III source gas in the second step while the Group V source gas flow rate is constant.

The adherence of magnesium to the surface of the AlGaN layer in growth makes predominant the growth in lateral directions, and reduces the crystal growth rate in the growth axis direction. This increases the frequency of regional growth of initial nuclei (three-dimensional); thus, the effective surface area is increased, and the frequency of magnesium introduction is improved by suppressing the migration of atoms. Therefore, forcible introduction of magnesium by the physical adherence, and improvement in the frequency of magnesium introduction due to the reduction in the growth rate improve the magnesium concentration of the AlGaN layer.

Further, since this effect is temporary, the above first step and the second step are repeated a plurality of times, so that the magnesium concentration of the AlGaN layer can be maintained at a constant high concentration. For example, even when a p-AlGaN layer having the aluminum composition ratio of 0.15 or more, which reduces the magnesium concentration due to the increase of the ionization energy of magnesium itself is formed, a p-AlGaN layer having higher magnesium concentration than conventional can be manufactured.

Furthermore, in a method of manufacturing a p-AlGaN layer in accordance with the present invention, one p-AlGaN layer doped with magnesium is formed particularly using the above-mentioned MOCVD system 100 by previously performing a step of supplying a Group III source gas at a flow rate reduced to a level that allows only initial nuclei to grow and supplying a Group V source gas and a gas containing magnesium before the step of supplying a gas containing magnesium along with the Group III and Group V source gases at flow rates which allow crystals to grow. Thus, the magnesium doping level in the p-AlGaN layer can be maintained.

As initial nuclei have portions containing sufficient Mg, which have been forcibly formed in the initial growth, the source materials to be supplied later are predominantly diffused in lateral directions and their crystal growth rates in the growth axis direction are reduced accordingly. In other words, the diffused molecules are introduced into step ends at a higher rate, which promotes the formation of a flat layer (surfactant effect). However, this effect is temporary and initial growth nuclei causing irregularities begin to form again after the step flow growth (growth in lateral directions) continued for a while. This involves increase in the surface area to suppress in-plane diffusion of Mg itself, and the introduction frequency of Mg into the layer is improved, which consequently improves the magnesium concentration in the AlGaN layer.

Thus, according to the present invention, a step of supplying the Group III gas at a flow rate reduced to a level that allows only initial nuclei to grow and supplying the Group V source gas and the gas containing magnesium is provided, so that introduction of Mg can be improved and the crystallinity can be improved by growth in lateral directions.

The Group III source gas flow rate ($A_1$ or $A_3$) in the first step is different from the Group III source gas flow rate $A_2$ in the second step, and the Group III source gas flow rate in the first step is preferably ½ or less, more preferably ¼ or less the Group III source gas flow rate $A_2$ in the second step. In particular, the relationship between the Group III source gas flow rate and the crystal growth rate is evaluated from the thickness of a layer grown per unit time in a range where crystal growth can be observed (namely, crystal growth rate) (for example, the relationship between a plurality of pairs of Group III source gas flow rates and crystal growth rates in a flow rate range of 10 sccm to 30 sccm is linearized). When the Group III source gas flow rate ($A_1$ or $A_3$) in the first step is extrapolated from this relationship, the flow rate is preferably such that the crystal growth rate of the p-$Al_xGa_{1-x}N$ layer that corresponds to the flow rate ($A_1$ or $A_3$) in the first step is 0.03 nm/s or less, more preferably 0.01 nm/s to 0.03 nm/s based on the computation. Note that the figure of the Group III source gas flow rate in the first step and the second step (the ratio of Ga and Al) may not necessarily show the multiple proportion relationship. Specifically, the Al composition of the initial growth nuclei created in the first step may not necessarily be the same as the Al composition of the initial growth nuclei created in the second step. This is for making the initial growth nuclei created in the first step contain Mg at a maximum and for improving the crystallinity of a crystal film formed in the second step, thereby maximizing the effect of the present invention. Note that although the Al compositions are different, the crystal layers obtained in the mode of the present invention can be deemed to have constant Al composition because an initial growth nuclei created in the first step has negligible thickness as compared to the crystal film formed in the second step. In addition, when the computational growth rate is 0.01 nm/s to 0.03 nm/s, the Group III source material is less probable to be present in the substrate surface; for example, only island-like initial growth nuclei are created. Thus, the thickness does not increase enough to form a substantial layer even over a long period of time. Note that if the Group III source gas flow rate in the first step is computationally a flow rate such that the crystal growth rate is less than 0.01 nm/s, the decomposition of the initial growth nuclei becomes predominant over its growth. Thus, p-AlGaN is not grown.

The flow rate of the Group III source gas which allows only initial nuclei to grow cannot be specified definitely because it varies depending on the shape, temperature, and the Group V source gas flow rate of the MOCVD system. However, the Group III source gas flow rate ($A_1$ or $A_3$) in the first step is preferably, for example, 1 sccm to 10 sccm while the Group III source gas flow rate $A_2$ in the second step is 20 sccm to 50 sccm. Further, the Group V source gas flow rates $B_1$ and $B_2$ in the first step and the second step may be, for example, 5 slm to 50 slm (standard liter per minute). Further, the Mg-containing gas flow rates $C_1$ and $C_2$ in the first step and the second step may be, for example, 20 sccm to 200 sccm.

In either case where no Group III source gas is flown ($A_1$=0 sccm) or where the Group III source gas is flown to allow only initial nuclei to grow ($A_1$, $A_3$=1 sccm to 10 sccm) in the first step, the magnesium concentration of the AlGaN layer can be maintained at a high, constant concentration by repeating the first step and the second step a plurality of times. However, it is more preferable to allow initial nuclei to grow because the effect of improving crystallinity can be achieved more easily.

A p-AlGaN layer having high magnesium concentration and improved crystallinity can be manufactured by the above methods of the present invention.

Further, the aluminum composition ratio of the p-AlGaN layer may be 0 to 0.8. Note that the aluminum composition ratio x can be found by measuring the emission wavelength of photoluminescence and converting the emission wavelength of photoluminescence using Bowing parameters described in Yun F. et al, J. Appl. Phys. 92, 4837 (2002).

Subsequently, embodiments of a Group III nitride semiconductor light emitting device of the present invention will be described with reference to the drawings. A Group III nitride semiconductor light emitting device 200 in accordance with the present invention may have a structure including an AlN template substrate having an AlN strain buffer layer 202 on a sapphire substrate 201; and a superlattice strain buffer layer 203, an n-AlGaN layer 204, a light emitting layer 205, a p-AlGaN blocking layer 206, a p-AlGaN guide layer 207, a p-AlGaN cladding layer 208, and a p-GaN contact layer 209 on the AlN template substrate. These p-AlGaN layers can be grown by the above methods of manufacturing a p-AlGaN layer in accordance with the present invention.

Further, according to the methods of manufacturing a p-AlGaN layer in accordance with the present invention, a p-AlGaN layer having a carrier concentration of $5 \times 10^{17}/cm^3$ or more and preferably $1 \times 10^{18}/cm^3$ or less can be obtained as a magnesium-doped p-$Al_xGa_{1-x}N$ layer having a constant aluminum composition ratio when the aluminum composition ratio x is 0.2 or more and less than 0.3. Further, when the aluminum composition ratio x is 0.3 or more and less than 0.4, a p-AlGaN layer having a carrier concentration of $3.5 \times 10^{17}/cm^3$ or more and preferably $5 \times 10^{17}/cm^3$ or less can be obtained. Furthermore, when the aluminum composition ratio x is 0.4 or more and less than 0.5, a p-AlGaN layer having a carrier concentration of $2.5 \times 10^{17}/cm^3$ or more and preferably $3.5 \times 10^{17}/cm^3$ or less can be obtained.

Note that FIGS. 1 to 6 show examples of representative alternative embodiments, and the present invention is not limited to these embodiments.

EXAMPLE

Example 1

In Example 1, after an AlN template substrate having a strain buffer layer was placed in a growth furnace shown in FIG. 1 and FIG. 2 and the temperature was increased to 1050° C. at 10 kPa, a first step and a second step were alternately repeated 120 times. In each of the first steps, while Group III source gases (TMG flow rate: 4 sccm, TMA flow rate: 5 sccm) were flown, a carrier gas (mixture of $N_2$ and $H_2$, flow rate: 50 slm), a Group V source gas ($NH_3$, flow rate: 15 slm), and a $CP_2Mg$ gas (flow rate: 50 sccm) were supplied for 15 seconds (supply time $t_1$). In each of the subsequent second steps, only the flow rates of the Group III source gases were changed to a TMG flow rate of 20 sccm and a TMA flow rate of 25 sccm, and the Group III source gases, the carrier gas, the Group V source gas, and the $CP_2Mg$ gas were supplied for 60 seconds (supply time $t_2$). Thus, a p-$Al_{0.23}Ga_{0.77}N$ layer having a thickness of 1080 nm was formed. (Note that the unit "sccm" of the above flow rates expresses the amount ($cm^3$) of gas flown per minute at 1 atm (atmospheric pressure: 1013 hPa) at 0° C.) Note that in the first step, initial growth nuclei were grown, but a layer was not grown. The crystal growth rate in the second step was 0.15 nm/s. The computational growth rate corresponding to the Group III source gas flow rate in the first step was 0.03 nm/s.

Example 2

In Example 2, a p-$Al_{0.23}Ga_{0.77}N$ layer having a thickness of 1080 nm was formed by a similar method to Example 1 except for that the supply time $t_2$ was 30 seconds, and the repeat count was 240.

Example 3

In Example 3, a p-$Al_{0.23}Ga_{0.77}N$ layer having a thickness of 1080 nm was formed by a similar method to Example 1 except for that the supply time $t_2$ was 45 seconds, and the repeat count was 180.

Example 4

In Example 4, a p-$Al_{0.23}Ga_{0.77}N$ layer having a thickness of 1080 nm was formed by a similar method to Example 1 except for that the supply time $t_2$ was 120 seconds, and the repeat count was 60.

Example 5

In Example 5, a p-$Al_{0.23}Ga_{0.77}N$ layer having a thickness of 1080 nm was formed by a similar method to Example 1 except for that the supply time $t_2$ was 7200 seconds, and the repeat count was one.

Reference Example

In Reference Example, a p-$Al_{0.23}Ga_{0.77}N$ layer having a thickness of 1080 nm was formed by a similar method to Example 5 except for that no Group III source gas was flown and no initial growth nucleus was grown in the first step.

Comparative Example 1

In Comparative Example 1, a p-$Al_{0.23}Ga_{0.77}N$ layer having a thickness of 1080 nm was formed by a similar method to Example 1 except for that the supply time $t_1$ was 0 second, the supply time $t_2$ was 7200 seconds, and the repeat count was one.

(Evaluation 1)

After each of the forgoing Examples 1 to 5, Reference Example, and Comparative Example 1; annealing was performed at 800° C. for 5 minutes in a nitrogen atmosphere using a lamp annealing furnace. Then, the in-plane specific resistance of the p-AlGaN layers was measured using an eddy current sheet resistance measurement system (MODEL1318 manufactured by Lehighton Electronics, inc). The results of evaluating carrier concentrations calculated from the specific resistances under conditions where the activation depth is 0.5 μm and the mobility is 5 are shown in Table 2.

TABLE 2

| p-AlGaN single film layer | Al composition ratio | Supply time t1 (second) | Supply time t2 (second) | Repeat count r (number) | Thickness per repetition (nm) | Total thickness of single film layer (nm) | Specific resistance (W × cm) | Carrier concentration calculated from Specific resistance (/cm3) |
|---|---|---|---|---|---|---|---|---|
| Example 1 | 0.23 | 15 | 60 | 120 | 9 | 1080 | 1.7 | 7.35 ' 1017 |
| Example 2 | 0.23 | 15 | 30 | 240 | 4.5 | 1080 | 2.19 | 5.70 ' 1017 |
| Example 3 | 0.23 | 15 | 45 | 180 | 6 | 1080 | 2 | 6.24 ' 1017 |
| Example 4 | 0.23 | 15 | 120 | 60 | 18 | 1080 | 2.67 | 4.67 ' 1017 |
| Example 5 | 0.23 | 15 | 7200 | 1 | 1080 | 1080 | 2.7 | 4.63 ' 1017 |
| Reference Example | 0.23 | 15 | 7200 | 1 | 1080 | 1080 | 2.73 | 4.58 ' 1017 |
| Comparative Example 1 | 0.23 | 0 | 7200 | 1 | 1080 | 1080 | 2.75 | 4.53 ' 1017 |

Table 2 shows that the specific resistances in Examples 1 to 5 were reduced as compared with Comparative Example 1, therefore Examples 1 to 5 in accordance with the present invention have an effect of increasing carrier concentration as compared with Comparative Example 1.

Example 6

In Example 6, after an AlN template substrate having a strain buffer layer was placed in a growth furnace shown in FIG. 1 and FIG. 2 and the temperature was increased to 1050° C. at 10 kPa, a first step and a second step were alternately repeated 120 times. In each of the first steps, while a Group III source gas (TMG flow rate: 5 sccm) was flown, a carrier gas (mixture of $N_2$ and $H_2$, flow rate: 50 slm), a Group V source gas ($NH_3$, flow rate: 15 slm), and a $CP_2Mg$ gas (flow rate: 50 sccm) were supplied for 15 seconds (supply time $t_1$). In each of the subsequent second steps, only the flow rate of the Group III source gas was changed to a TMG flow rate of 20 sccm, and the Group III source gas, the carrier gas, the Group V source gas, and the $CP_2Mg$ gas were supplied for 60 seconds (supply time $t_2$). Thus, a p-GaN layer having a thickness of 1080 nm was formed. Note that in the first step, initial growth nuclei were grown, but a layer was not grown. The crystal growth rate in the second step was 0.15 nm/s. The computational growth rate corresponding to the Group III source gas flow rate in the first step was 0.02 nm/s.

Example 7

In Example 7, after an AlN template substrate having a strain buffer layer was placed in a growth furnace shown in FIG. 1 and FIG. 2 and the temperature was increased to 1050° C. at 10 kPa, a first step and a second step were alternately repeated 120 times. In each of the first steps, while Group III source gases (TMG flow rate: 2 sccm, TMA flow rate: 5 sccm) were flown, a carrier gas (mixture of $N_2$ and $H_2$, flow rate: 50 slm), a Group V source gas ($NH_3$, flow rate: 15 slm), and a $CP_2Mg$ gas (flow rate: 50 sccm) were supplied for 15 seconds (supply time $t_1$). In each of the subsequent second steps, only the flow rates of the Group III source gases were changed to a TMG flow rate of 20 sccm and a TMA flow rate of 45 sccm, and the Group III source gases, the carrier gas, the Group V source gas, and the $CP_2Mg$ gas were supplied for 60 seconds (supply time $t_2$). Thus, a p-$Al_{0.36}Ga_{0.64}N$ layer having a thickness of 1080 nm was formed. Note that in the first step, initial growth nuclei were grown, but a layer was not grown. The crystal growth rate in the second step was 0.15 nm/s. The computational growth rate corresponding to the Group III source gas flow rate in the first step was 0.02 nm/s.

Example 8

In Example 8, a p-$Al_{0.43}Ga_{0.57}N$ layer having a thickness of 1080 nm was formed by a similar method to Example 7 except for the following: in each of the first steps, while Group III source gases (TMG flow rate: 2 sccm, TMA flow rate: 6 sccm) were flown, a carrier gas (mixture of $N_2$ and $H_2$, flow rate: 50 slm), a Group V source gas ($NH_3$, flow rate: 15 slm) and a $CP_2Mg$ gas (flow rate: 50 sccm) were supplied for 15 seconds (supply time $t_1$); in each of the subsequent second steps, only the flow rates of the Group III source gases were changed to a TMG flow rate of 20 sccm and a TMA flow rate of 65 sccm, and the Group III source gases, the carrier gas, the Group V source gas, and the $CP_2Mg$ gas were supplied for 60 seconds (supply time $t_2$); and the first step and the second step were alternately repeated. Note that in the first step, initial growth nuclei were grown, but a layer was not grown. The crystal growth rate in the second step was 0.15 nm/s. The computational growth rate corresponding to the Group III source gas flow rate in the first step was 0.02 nm/s.

Comparative Example 2

In Comparative Example 2, a p-GaN layer having a thickness of 1080 nm was formed by a similar method to Example 6 except for that the supply time $t_1$ was 0 second, the supply time $t_2$ was 7200 seconds, and the repeat count was one.

Comparative Example 3

In Comparative Example 3, a p-$Al_{0.23}Ga_{0.77}N$ layer having a thickness of 1080 nm was formed by a similar method to Example 1 except for that the supply time $t_1$ was 0 second, the supply time $t_2$ was 7200 seconds, and the repeat count was one.

Comparative Example 4

In Comparative Example 4, a p-$Al_{0.36}Ga_{0.64}N$ layer having a thickness of 1080 nm was formed by a similar method to Example 7 except for that the supply time $t_1$ was 0 second, the supply time $t_2$ was 7200 seconds, and the repeat count was one.

Comparative Example 5

In Comparative Example 5, a p-$Al_{0.43}Ga_{0.57}$ layer having a thickness of 1080 nm was formed by a similar method to Example 8 except for that the supply time $t_1$ was 0 second, the supply time $t_2$ was 7200 seconds, and the repeat count was one.

Example 9

Figure 6:
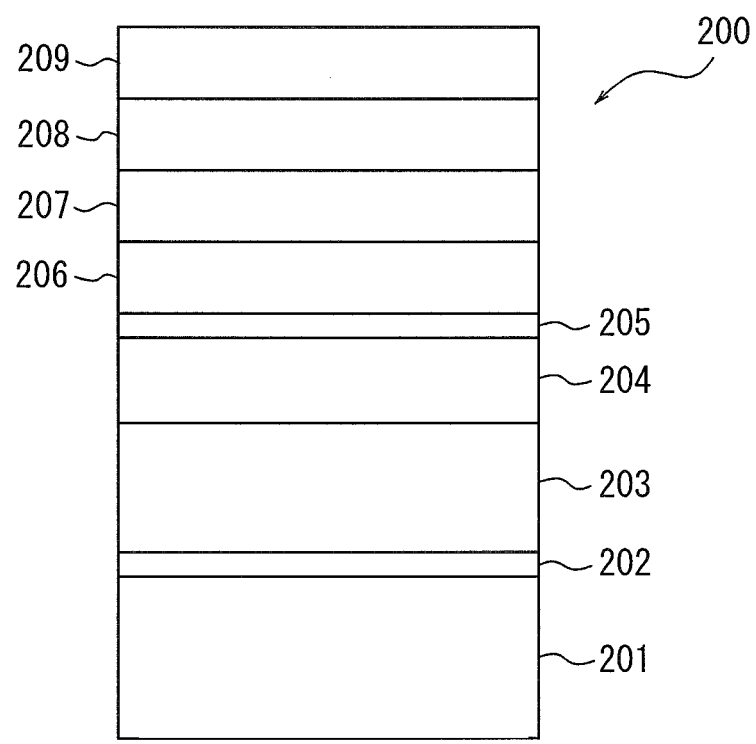
FIG. 6 is a schematic cross-sectional view illustrating a Group III nitride semiconductor light emitting device in accordance with the present invention.

As shown in FIG. 6, a superlattice strain buffer layer (AlN/GaN, thickness: 600 nm), an n-$Al_{0.23}Ga_{0.77}N$ layer (thickness: 1300 nm), a light emitting layer (AlInGaN, thickness: 150 nm), a p-$Al_{0.36}Ga_{0.64}N$ blocking layer (thickness: 20 nm), a p-$Al_{0.23}Ga_{0.77}N$ cladding layer (thickness: 180 nm), and a p-GaN contact layer (thickness: 20 nm) were grown on an AlN template substrate having an AlN strain buffer layer on a sapphire substrate by MOCVD process to produce a Group III nitride semiconductor light emitting device.

Here, the p-$Al_{0.36}Ga_{0.64}N$ blocking layer was formed by a similar method to Example 7 except for that the supply time $t_1$ was 15 seconds, the supply time $t_2$ was 45 seconds, and the repeat count was three.

Comparative Example 6

In Comparative Example 6, a Group III nitride semiconductor light emitting device having a p-$Al_{0.36}Ga_{0.44}N$ blocking layer was produced by a similar method to Example 9 except for that the supply time $t_1$ was 0 second, the supply time $t_2$ was 135 seconds, and the repeat count was one.

Comparative Example 7

In Comparative Example 7, a Group III nitride semiconductor light emitting device having a p-$Al_{0.43}Ga_{0.57}N$ blocking layer was produced by a similar method to Example 10 except for that the supply time $t_1$ was 0 second, the supply time $t_2$ was 135 seconds, and the repeat count was one.

(Evaluation 2)

Figure 7:
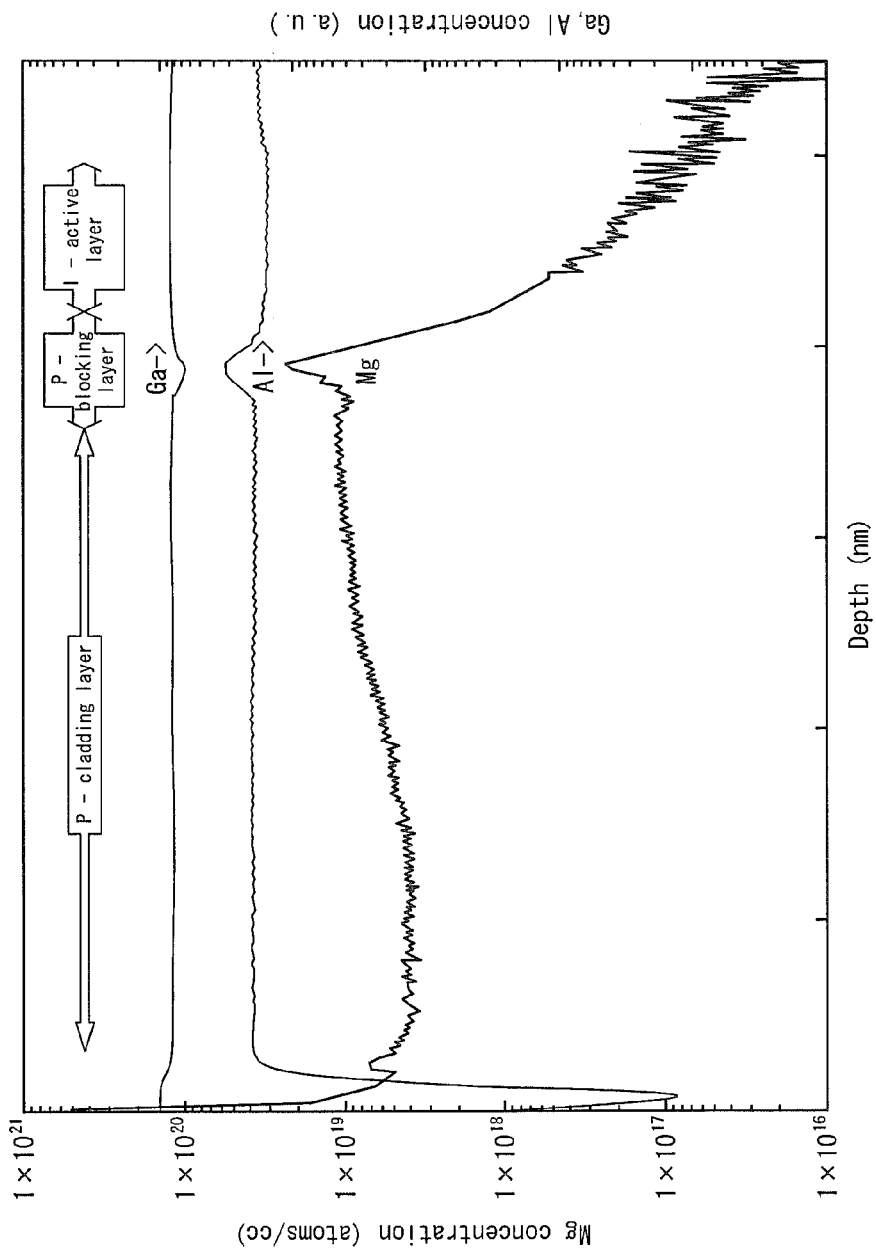
FIG. 7 shows a SIMS profile of a p-$Al_{0.36}Ga_{0.64}N$ layer in a light emitting device of Example 9.
Figure 8:
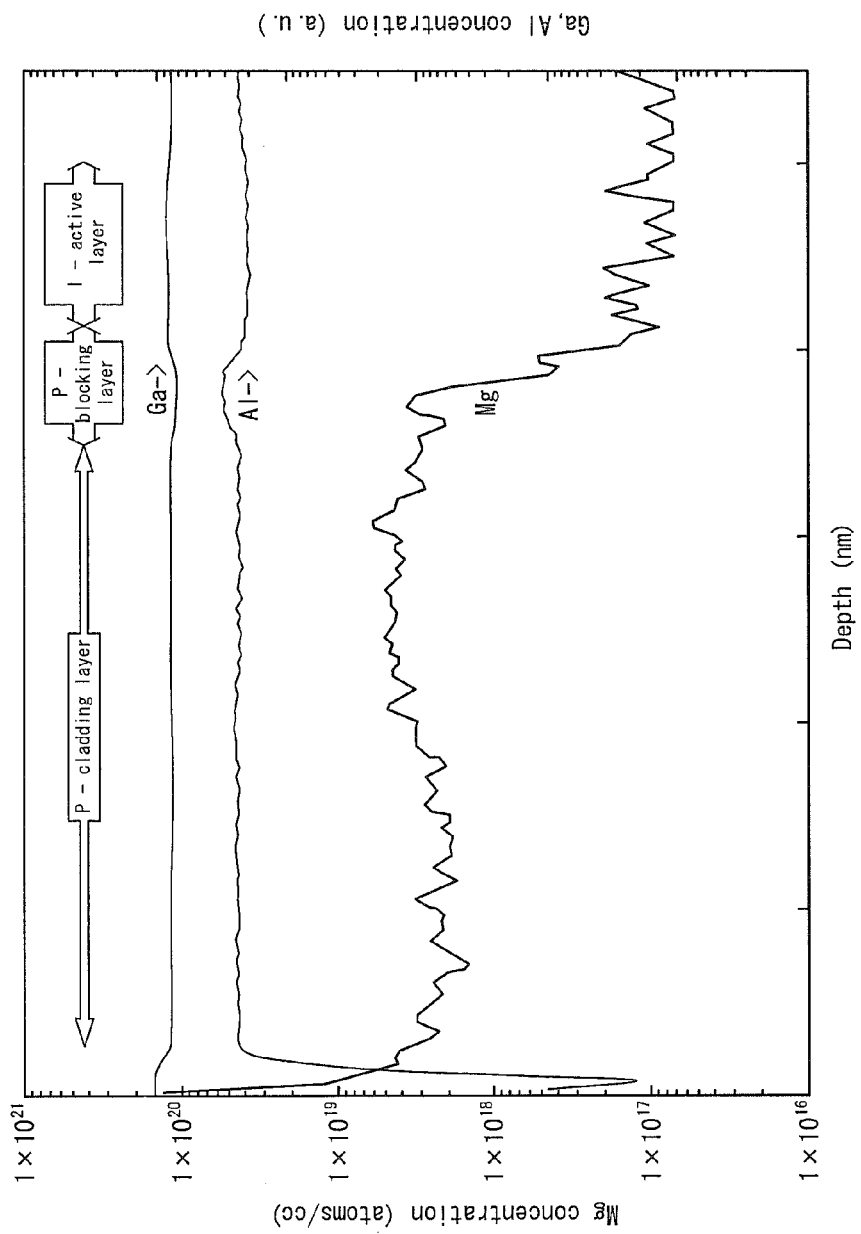
FIG. 8 shows a SIMS profile of a p-$Al_{0.36}Ga_{0.64}$ layer in a light emitting device of Comparative Example 6.

The results of measuring the magnesium concentration of the p-AlGaN blocking layers in the light emitting devices of Example 9 and Comparative Example 6 using a SIMS (secondary ion mass spectrometer) are shown in FIG. 7 and FIG. 8, respectively.

Figure 9:
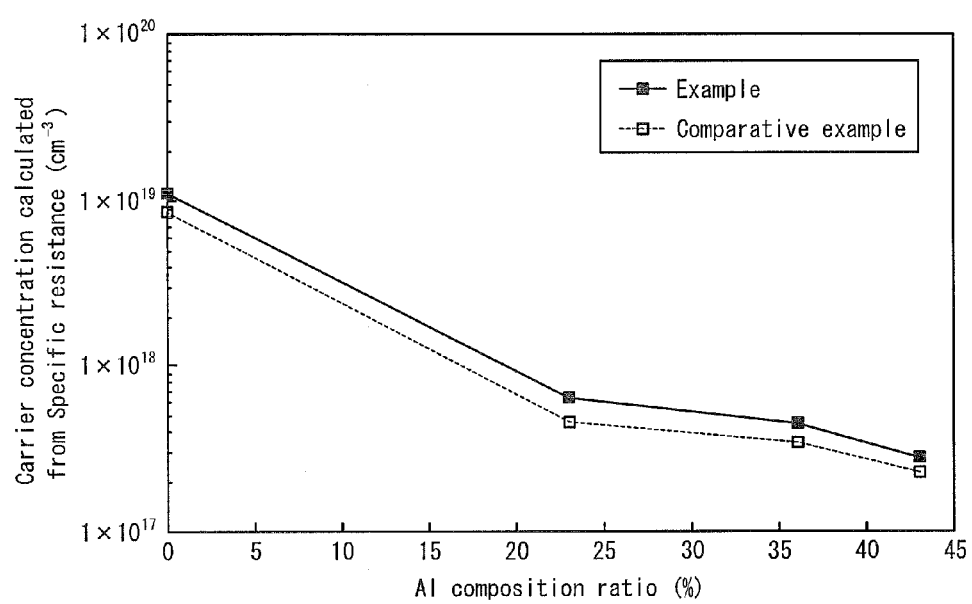
FIG. 9 is a graph showing collected carrier concentrations calculated from specific resistance values of p-$Al_xGa_{1-x}N$ layers in accordance with a method of the present invention and a conventional method.

Further, as in Evaluation 1, the carrier concentrations were calculated from the specific resistance of the p-AlGaN single film layers. The results are shown in Table 3 and FIG. 9.

TABLE 3

| p-AlGaN single film layer | Al composition ratio | Supply time t1 (second) | Supply time t2 (second) | Repeat count r (number) | Thickness per repetition (nm) | Total thickness of single film layer (nm) | Specific resistance (W × cm) | Carrier concentration calculated from Specific resistance (/cm3) |
|---|---|---|---|---|---|---|---|---|
| Example 6 | 0 | 15 | 60 | 120 | 9 | 1080 | 0.113 | 1.10 ' 1019 |
| Example 1 | 0.23 | 15 | 60 | 120 | 9 | 1080 | 1.7 | 7.35 ' 1017 |
| Example 7 | 0.36 | 15 | 60 | 120 | 9 | 1080 | 2.76 | 4.52 ' 1017 |
| Example 8 | 0.43 | 15 | 60 | 120 | 9 | 1080 | 4.47 | 2.79 ' 1017 |
| Comparative Example 2 | 0 | 0 | 7200 | 1 | 1080 | 1080 | 0.146 | 8.57 ' 1018 |
| Comparative Example 3 | 0.23 | 0 | 7200 | 1 | 1080 | 1080 | 2.75 | 4.53 ' 1017 |
| Comparative Example 4 | 0.36 | 0 | 7200 | 1 | 1080 | 1080 | 3.62 | 3.45 ' 1017 |
| Comparative Example 5 | 0.43 | 0 | 7200 | 1 | 1080 | 1080 | 5.42 | 2.30 ' 1017 |

Example 10

In Example 10, as shown in FIG. 6, a superlattice strain buffer layer (AlN/GaN, thickness: 600 nm), an n-$Al_{0.23}Ga_{0.77}N$ layer (thickness: 1300 nm), a light emitting layer (AlInGaN, thickness: 150 nm), a p-$Al_{0.43}Ga_{0.57}N$ blocking layer (thickness: 20 nm), a p-$Al_{0.23}Ga_{0.77}N$ cladding layer (thickness: 180 nm), and a p-GaN contact layer (thickness: 20 nm) were grown on an AlN template substrate having an AlN strain buffer layer on a sapphire substrate by MOCVD process to produce a Group III nitride semiconductor light emitting device.

Here, the p-$Al_{0.43}Ga_{0.57}N$ blocking layer was formed by a similar method to Example 8 except for that the supply time $t_1$ was 10 seconds, the supply time $t_2$ was 45 seconds, and the repeat count was three.

Table 3 shows that the magnesium concentrations in Examples 6, 1, 7, and 8 in accordance with the present invention are higher than those of Comparative Examples 2, 3, 4, and 5 involving the same Al compositions, respectively. This also leads to increase in the effective carrier concentration, which consequently reduces the specific resistance.

Evaluation 3

Further, the emission EL outputs of back side of the light emitting devices of the above Examples 9, 10, and Comparative Examples 6 and 7 were measured using a multichannel spectrometer (C10082CAH manufactured by Hamamatsu Photonics K.K.). The results are shown in Table 4.

TABLE 4

| p-AlGaN blocking layer in Light emitting device | Al composition ratio | Supply time t1 (second) | Supply time t2 (second) | Repeat count r (number) | Thickness per repetition (nm) | Total thickness of single film layer (nm) | EL output (mW) |
|---|---|---|---|---|---|---|---|
| Example 9 | 0.36 | 15 | 45 | 3 | 6.67 | 20 | 33.1 |
| Example 10 | 0.43 | 10 | 45 | 3 | 6.67 | 20 | 25 |
| Comparative Example 6 | 0.36 | 0 | 135 | 1 | 20 | 20 | 15.5 |
| Comparative Example 7 | 0.43 | 0 | 135 | 1 | 20 | 20 | 6.9 |

Table 4 shows that the EL output of Example 9 in accordance with the present invention is significantly improved as compared with Comparative Example 6. Further, the effect of improved output can also be confirmed in Example 10 involving a higher Al composition ratio as compared with Comparative Example 7. These results are considered due to the improvement in energization accompanying the increase in the carrier concentration as apparent from Table 4.

INDUSTRIAL APPLICABILITY

According to the present invention, a p-AlGaN layer having a carrier concentration and a light output which are improved by forming one p-AlGaN layer doped with magnesium using MOCVD under conditions where a Group III source gas is supplied in a first step at a flow rate of 0 or at a flow rate equal to or less than a flow rate of a Group III source gas supplied in a second step can be provided. The present invention can also provide a method of manufacturing the same and a Group III nitride semiconductor light emitting device.

Further, the present invention can provide a p-AlGaN layer achieving a carrier concentration and a light output which are improved by repeating the first step and the second step a plurality of times, a method of manufacturing the same, and a Group III nitride semiconductor light emitting device.

EXPLANATION OF REFERENCE NUMERALS

100: MOCVD system
101: First gas supply port
102: Second gas supply port
103: Growth furnace
104: Hydrogen gas
105: Nitrogen gas
106: TMA
107: TMG
108: CP$_2$Mg
109: Ammonia
110: Susceptor
111: Base substrate
112: AlGaN layer
200: Group III nitride semiconductor light emitting device
201: Base substrate
202: AlN strain buffer layer
203: Superlattice strain buffer layer
204: N-nitride semiconductor layer
205: Light emitting layer
206: P-AlGaN blocking layer
207: P-AlGaN guide layer
208: P-AlGaN cladding layer
209: P-GaN contact layer

The invention claimed is:

1. A method of manufacturing a p-AlGaN layer, the p-AlGaN layer being one p-Al$_x$Ga$_{1-x}$N layer ($0 \leq x < 1$) doped with magnesium, which is formed by MOCVD, comprising the steps of:
 a first step of supplying a Group V source gas at a Group V source gas flow rate $B_1$ ($0 < B_1$) and supplying a gas containing magnesium at a Mg-containing gas flow rate $C_1$ ($0 < C_1$) while supplying a Group III source gas at a Group III source gas flow rate $A_3$ ($0 < A_3$); and
 a second step of supplying a Group V source gas at a Group V source gas flow rate $B_2$ ($0 < B_2$) and supplying a gas containing magnesium at a Mg-containing gas flow rate $C_2$ ($0 < C_2$) while supplying a Group III source gas at a Group III source gas flow rate $A_2$ ($0 < A_2$),
 wherein the first step and the second step are performed to form the p-Al$_x$Ga$_{1-x}$N layer, and
 the Group III source gas flow rate $A_3$ is a flow rate which allows only initial growth nuclei of the p-Al$_x$Ga$_{1-x}$N layer to grow and satisfies $A_3 \leq 0.5 A_2$.

2. A method of manufacturing a p-AlGaN layer, the p-AlGaN layer being one p-Al$_x$Ga$_{1-x}$N layer ($0 \leq x < 1$) doped with magnesium, which is formed by MOCVD, comprising the steps of:
 a first step of supplying a Group V source gas at a Group V source gas flow rate $B_1$ ($0 < B_1$) and supplying a gas containing magnesium at a Mg-containing gas flow rate $C_1$ ($0 < C_1$) while supplying a Group III source gas at a Group III source gas flow rate $A_3$ ($0 < A_3$); and
 a second step of supplying a Group V source gas at a Group V source gas flow rate $B_2$ ($0 < B_2$) and supplying a gas containing magnesium at a Mg-containing gas flow rate $C_2$ ($0 < C_2$) while supplying a Group III source gas at a Group III source gas flow rate $A_2$ ($0 < A_2$),
 wherein the first step and the second step are repeated a plurality of times to form the p-Al$_x$Ga$_{1-x}$N layer, and
 the Group III source gas flow rate $A_3$ is a flow rate which allows only initial growth nuclei of the p-Al$_x$Ga$_{1-x}$N layer to grow and satisfies $A_3 \leq 0.5 A_2$.

3. The method of manufacturing a p-AlGaN layer according to claim 1, wherein
 the Group V source gas flow rate $B_1$ in the first step is equal to the Group V source gas flow rate $B_2$ in the second step; and/or
 the Mg-containing gas flow rate $C_1$ in the first step is equal to the Mg-containing gas flow rate $C_2$ in the second step.

4. The method of manufacturing a p-AlGaN layer according to claim 1, wherein, when a relationship between the Group III source gas flow rate and a crystal growth rate is evaluated from the crystal growth rate in the second step, the Group III source gas flow rate in the first step is a flow rate such that a growth rate of the p-$Al_xGa_{1-x}N$ layer corresponding to the flow rate is 0.03 nm/s or less.

5. The method of manufacturing a p-AlGaN layer according to claim 1, wherein the aluminum composition ratio x of the p-$Al_xGa_{1-x}N$ layer is in a range of 0 to 0.8.

6. The method of manufacturing a p-AlGaN layer according to claim 2, wherein
the Group V source gas flow rate $B_1$ in the first step is equal to the Group V source gas flow rate $B_2$ in the second step; and/or
the Mg-containing gas flow rate $C_1$ in the first step is equal to the Mg-containing gas flow rate $C_2$ in the second step.

7. The method of manufacturing a p-AlGaN layer according to claim 2, wherein, when a relationship between the Group III source gas flow rate and a crystal growth rate is evaluated from the crystal growth rate in the second step, the Group III source gas flow rate in the first step is a flow rate such that a growth rate of the p-$Al_xGa_{1-x}N$ layer corresponding to the flow rate is 0.03 nm/s or less.

8. The method of manufacturing a p-AlGaN layer according to claim 2, wherein the aluminum composition ratio x of the p-$Al_xGa_{1-x}N$ layer is in a range of 0 to 0.8.

9. The method of manufacturing a p-AlGaN layer according to claim 1, wherein the Group III source gas flow rate $A_2$ is a flow rate which allows the initial growth nuclei of the p-$Al_xGa_{1-x}N$ layer to grow and form a substantial layer.

10. The method of manufacturing a p-AlGaN layer according to claim 2, wherein the Group III source gas flow rate $A_2$ is a flow rate which allows the initial growth nuclei of the p-$Al_xGa_{1-x}N$ layer to grow and form a substantial layer.

* * * * *